United States Patent
Côté et al.

(10) Patent No.: US 10,185,787 B1
(45) Date of Patent: Jan. 22, 2019

(54) TOOL FOR ACCURATE ONSITE MODEL VISUALIZATION THAT FACILITATES ENVIRONMENT INTERACTION

(71) Applicant: Bentley Systems, Incorporated, Exton, PA (US)

(72) Inventors: Stéphane Côté, Lac Beauport (CA); Antoine Girard-Vallée, Sherbrooke (CA)

(73) Assignee: Bentley Systems, Incorporated, Exton, PA (US)

( * ) Notice: Subject to any disclaimer, the term of this patent is extended or adjusted under 35 U.S.C. 154(b) by 363 days.

(21) Appl. No.: 15/091,796

(22) Filed: Apr. 6, 2016

(51) Int. Cl.
*G06F 17/50* (2006.01)
*G06F 17/11* (2006.01)

(52) U.S. Cl.
CPC .............. *G06F 17/50* (2013.01); *G06F 17/11* (2013.01)

(58) Field of Classification Search
USPC ...... 703/2, 22; 345/419, 424; 348/42, 49, 54
See application file for complete search history.

(56) References Cited

U.S. PATENT DOCUMENTS

| | | | |
|---|---|---|---|
| 6,094,625 A | 7/2000 | Ralston | |
| 6,154,213 A | 11/2000 | Rennison et al. | |
| 8,687,042 B2* | 4/2014 | Karaoguz | G06F 3/14 348/42 |
| 8,843,350 B2 | 9/2014 | Jacobi et al. | |
| 8,922,545 B2* | 12/2014 | Bennett | G06F 3/14 345/419 |
| 8,964,013 B2* | 2/2015 | Bennett | G06F 3/14 348/59 |
| 9,098,115 B2 | 8/2015 | Glueck et al. | |
| 9,846,972 B2* | 12/2017 | Montgomerie | G06T 19/006 |
| 2008/0297507 A1* | 12/2008 | Chen | G06T 17/20 345/424 |
| 2010/0188397 A1 | 7/2010 | Tsai et al. | |
| 2011/0066375 A1 | 3/2011 | France et al. | |
| 2011/0164034 A1* | 7/2011 | Bennett | G06F 3/14 345/419 |

(Continued)

OTHER PUBLICATIONS

Behzadan, Amir H., "ARVISCOPE: Georeferenced Visualization of Dynamic Construction Process in Three-Dimensional Outdoor Augmented Reality," A Dissertation, Civil Engineering, The University of Michigan, 2008, pp. 1-282.

(Continued)

*Primary Examiner* — Thai Q Phan
(74) *Attorney, Agent, or Firm* — Cesari and McKenna, LLP; James A. Blanchette

(57) ABSTRACT

In one embodiment, accurate onsite model visualization is provided by utilizing a user's location and orientation in the physical environment to control a view of a CAD model (and optional aligned point cloud), enabling the user to perceive the relationship between model data and locations in the physical environment. Instead of augmenting a view of the physical environment with virtual features, the user navigates within a virtual environment (consisting of the CAD model and optional point cloud) based on their movements in the physical environment. Based on such navigation, the user may determine when they have moved to a location in the physical environment that they would like to interact with (e.g., a location to mark), and interact with such location based on related model data.

22 Claims, 8 Drawing Sheets

(56) References Cited

U.S. PATENT DOCUMENTS

| | | | |
|---|---|---|---|
| 2014/0146038 A1 | 5/2014 | Kangas et al. | |
| 2014/0210947 A1 | 7/2014 | Finn et al. | |
| 2015/0070346 A1* | 3/2015 | Wang | G06T 15/205 345/419 |
| 2015/0310135 A1* | 10/2015 | Forsyth | G06F 17/5004 703/1 |

OTHER PUBLICATIONS

Côté, Stéphane, et al., "Augmentation of Live Excavation Work for Subsurface Utilities Engineering," IEEE, 2014 IEEE International Symposium on Mixed and Augmented Reality (ISMAR), Munich, Germany, Sep. 1-12, 2014, pp. 1-3.

Olalde, Karle, et al., "The importance of Geometry Combined with New Techniques for Augmented Reality," ScienceDirect, Procedia Computer Science, 2013 International Conference on Virtual and Augmented Reality in Education, Elsevier B. V., vol. 25, Nov. 26, 2013, pp. 136-143.

Roberts, Dr. Gethin W., et al., "The Use of Augmented Reality, GPS and INS for Subsurface Data Visualization," FIG XXII International Congress, Washington, D.C., USA, Apr. 19-26, 2002, pp. 1-12.

Schall, Gerhard, et al., "Handheld Augmented Reality for Underground Infrastructure Visualization," Springer-Verlag London Limited, Personal and Ubiquitous Computing, vol. 13, Issue 4, May 2009, pp. 281-291.

Su, Xing, et al., "Uncertainty-aware Visualization and Proximity Monitoring in Urban Excavation: A Geospatial Augmented Reality Approach," Visualization in Engineering a SpringerOpen Journal, vol. 1, No. 2, Jan. 2013, pp. 1-14.

Cote et al., U.S. Appl. No. 13/909,690 for Panoramic Video Augmented Reality, filed Jun. 4, 2013, 24 pages.

Cote, Stephane, U.S. Appl. No. 14/171,171 for Third Person View Augmented Reality, filed Feb. 3, 2014, 25 pages.

Cote et al., U.S. Appl. No. 13/847,909 for Visualization of 3-D GRP Data in Augmented Reality, filed Mar. 20, 2013, 26 pages.

* cited by examiner

TOOL FOR ACCURATE ONSITE MODEL VISUALIZATION THAT FACILITATES ENVIRONMENT INTERACTION

BACKGROUND

Technical Field

The present disclosure relates to computer aided design (CAD) model visualization, and more specifically, to techniques for accurate onsite model visualization that facilitate interaction (e.g., marking of locations) at a site based on model data.

Background Information

CAD models are widely used in the field of architecture, engineering and construction (AEC) to maintain and convey information useful in performing a wide variety of tasks, including site planning, system maintenance and repair, and asset identification and query, among others. In addition to providing information concerning objects that are directly visible at a site, models may convey information about objects that are not visible, for example, objects that have not yet been constructed or that have been constructed but are obscured from view (e.g., are buried underground, enclosed in wall cavities, etc.). Such non-visible objects are referred to herein as "hidden objects".

While models including data describing hidden objects may be used in many AEC fields, one common application is in utilities infrastructure installation and repair. In such application, a model may include elements that represent underground utilities (e.g., gas pipes, water pipes, sewer lines, electrical cables, etc.). Workers may refer to the model to attempt to understand where the utilities are located, and to learn characteristics of the utilities. Based on the information in the model, workers may interact with locations at a worksite, for example, mark locations (e.g., with colored spray paint or other markings), so that appropriate areas may be excavated and work performed.

In order to better convey the information embodied in models (including location information for hidden objects), attempts have been made to utilize augmented reality. Typically, in augmented reality, a view of the physical environment about a site captured by a camera is merged with computer-generated features, such that the computer generated features appear as if they are part of the scene. In contrast to virtual reality, where a simulated environment is shown to a user instead of the physical environment, augmented reality blends the virtual with the real to enhance a user's perception of the physical environment.

However, producing robust and accurate augmented reality presents technical challenges that has limited its widespread use in the field of AEC. One challenge is the issue of registration between the model and the view of the physical environment. Registration typically involves localizing a camera that captures the view of the physical environment in a coordinate system of the model. Various pose estimation and tracking techniques have been developed to address this task, and implemented in a research setting. However, such techniques still generally lack the reliability and accuracy desired for widespread in-field use. For example, typical image-based tracking techniques depend upon tracking identified features frame-by-frame in the view of the physical environment, and using the locations of these features in the view to localize the camera. However, environments with substantial movement (e.g., outdoor city environments that include numerous moving vehicles, people, vegetation, etc.) may hinder this tracking, such that the camera can not be reliably localized.

Even if the challenges of registration could be solved, conventional augmented reality may still not be the best solution for conveying model data. The stability requirements of typical augmented reality systems may hinder a user's ability to interact with locations (e.g., mark locations) in the physical environment. For example, augmented reality is often delivered on a mobile device (i.e., a tablet computer, smartphone, ultra mobile personal computer, (UMPC), or other similar device) that includes a camera the captures the view of the physical environment and a display screen on which the augmented reality view is shown. In such "hand-held augmented reality", the user generally needs to move the mobile device near an area of interest, orient the mobile device so that the camera captures the relevant portion of the physical environment, and then hold the mobile device stable in this orientation. Such requirements may make it difficult for the user to simultaneously interact with the physical environment based on model data (e.g., to mark locations based on the model data). For instance, if the user moves their body to mark a location, the mobile device may be jerked out of the proper orientation required to see the model data the markings are premised upon. Even if augmented reality is deployed using goggles or other wearable devices, requirements related to stability may still hinder interactions with the environment.

Accordingly, there is a need for new techniques for model visualization that may facilitate user interaction with the physical environment at a site (e.g., marking of locations) based on model data.

SUMMARY

Techniques are provided for accurate onsite model visualization that utilizes a user's location and orientation in the physical environment to control a view of a CAD model (and in some implementations a point cloud aligned therewith), enabling the user to perceive the relationship between model data and locations in the physical environment. Instead of augmenting a view of the physical environment with virtual features, the user navigates within a virtual environment (consisting of the CAD model and optional point cloud) based on their movements in the physical environment. Based on such navigation, the user may determine when they have moved to a location in the physical environment that they would like to interact with (e.g., a location to mark), and interact with such location based on related model data. Such techniques may avoid at least some of the above discussed challenges of registration and device stability in augmented reality, allowing for greater on-site usage of model data.

In one embodiment, accurate onsite model visualization is provided by a tracking unit (e.g., a robotic total station) deployed at a known location at the site, and a mobile unit (e.g., a unit including a mobile device co-located with a survey prism coupled to a survey pole) carried by a user as they move about at the site. Initially, a CAD model is aligned with the physical environment, e.g., by capturing a point cloud of the physical environment by the robotic total station, and aligning points in the model with corresponding points in the point cloud. In some implementations, the point cloud may be stored for later display. The location of the mobile unit is then tracked (e.g., by using the robotic total station to measure an angle and a distance to the survey prism, and performing trigonometric calculations). Orientation of the mobile unit may also be determined (e.g., by an orientation sensor of the mobile device or by tracking features in a view captured by a camera of the mobile device). Using this information (e.g., by a visualization application executing on the mobile device), a view of the model (and in some implementations, the aligned point cloud) is generated from the perspective of a virtual camera whose location and orientation in model space is based on the location and the orientation of the mobile unit in the physical environment, and such view displayed to the user (e.g., on the display screen of the mobile device they are carrying). The view includes a location indicator corresponding to the location of the mobile unit (e.g., or more specifically the survey pole) within the physical environment. As the user moves the mobile unit about in the physical environment, the view of the model (and optional aligned point cloud) is updated substantially in real-time. To convey model data related to hidden objects (e.g., underground objects, such as pipes), a virtual excavation may be imposed in the view of the model (and optional aligned point cloud), and one or more elements corresponding to hidden objects displayed within the context of the virtual excavation. Based on the view of the model (and optional aligned point cloud), a user interacts with (e.g., mark locations in) the physical environment, perceiving how model data corresponds with their current location in the physical environment. For example, based on the location indicator in the view of the model (and optional aligned point cloud), a user may mark the ground at the current location of the survey pole, thereby transferring location information to the site.

It should be understood that a variety of additional features and alternative embodiments may be implemented other than those discussed in this Summary. This Summary is intended simply as a brief introduction to the reader for the further description that follows, and does not indicate or imply that the examples mentioned herein cover all aspects of the disclosure, or are necessary or essential aspects of the disclosure.

BRIEF DESCRIPTION OF THE DRAWINGS

The application refers to the accompanying drawings of example embodiments, of which:

FIG. 4B is a screen shot of an example view of the model displayed by the visualization application, corresponding to the location and second orientation of FIG. 4a;

DETAILED DESCRIPTION

Figure 1:
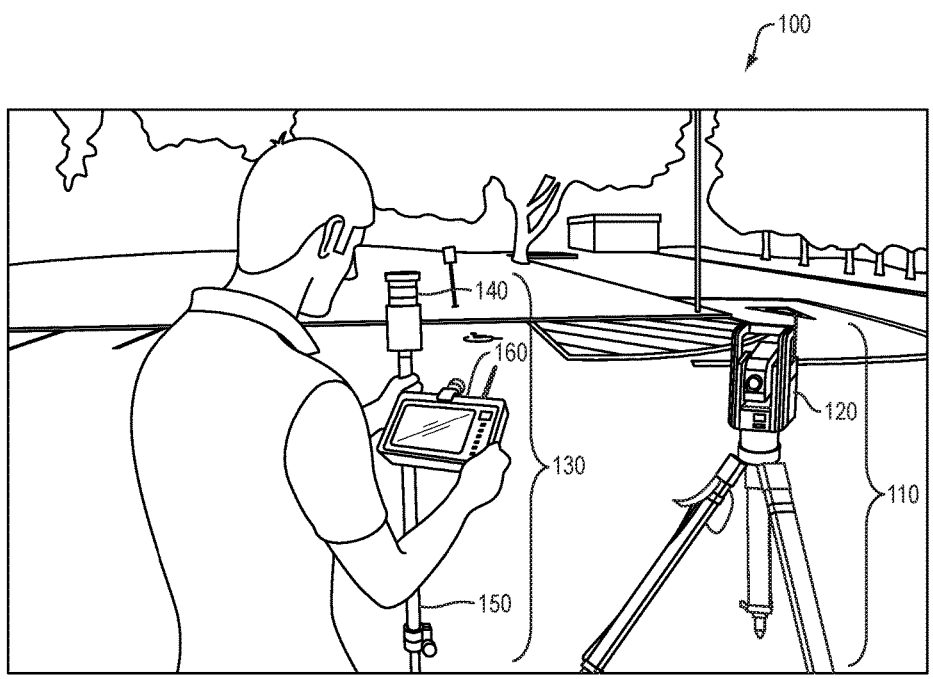
FIG. 1 is a diagram of an example system for providing accurate on-site model visualization that may facilitate user interaction with the physical environment (e.g., marking of locations) based on model data.

FIG. 1 is a diagram of an example system 100 for providing accurate on-site model visualization that may facilitate user interaction with the physical environment (e.g., marking of locations) based on model data. The system includes a tracking unit 110 deployed at a known location at the site, and a mobile unit 130 that is carried by a user as they move about in the physical environment at the site. In one embodiment, the tracking unit 110 takes the form of a robotic total station 120, i.e., a type of surveying instrument that integrates a remotely-controllable electronic transit theodolite with an electronic distance meter (EDM) to enable survey functions, and that may also include one or more digital imaging cameras to enable image capture and 3-D scanning functions. Further, in one embodiment, the mobile unit 130 may take the form of a mobile device 160, co-located with a survey prism 140 detectable by the robotic total station 120 coupled to a survey pole 150. The mobile device 160 may include hardware components such as a processor, a memory, a storage device, a display screen (e.g., a touch sensitive display), an orientation sensor, a camera, and a wireless network interface (e.g., a Wi-Fi interface), as well as other hardware components. The processor, memory and storage device may be utilized to execute a visualization application that implements at least some of the model visualization operations discussed below. It should be understood that at least some of these operations may alternatively be performed on the tracking unit 110, or one or more remote servers (not shown). The wireless network interface may be utilized to provide connectivity to the tracking unit 110, enabling receipt therefrom of a current location of the mobile unit 130. The orientation sensor may be utilized to provide a current orientation of the mobile unit 130. The camera may be utilized to capture a view of the physical environment, from which features may be tracked to determine the current orientation of the mobile unit 130, for example, as an alternative to using an the orientation sensor.

Figure 2:
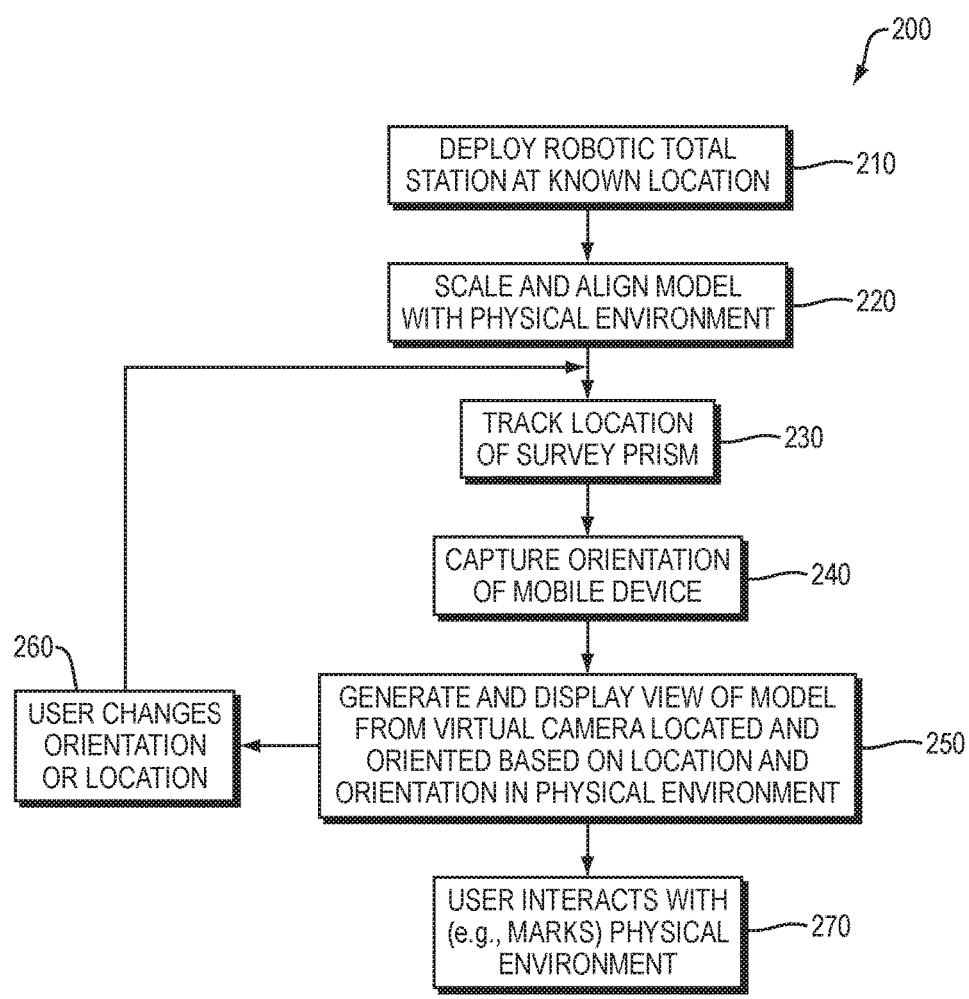
FIG. 2 is a flow diagram of an example sequence of steps that may be executed using the system of FIG. 1.

FIG. 2 is a flow diagram of an example sequence of steps 200 that may be executed using the system of FIG. 1. While such example steps 200 make reference to an embodiment where the tracking unit 110 takes the form of a robotic total station 120, and the mobile unit 130 takes the form of a mobile device 160, co-located with a survey prism 140 coupled to a survey pole 150, it should be understood that such steps may alternatively be implemented using different hardware components.

At step 210, the robotic total station 120 is deployed at the site and its location determined using standard surveying techniques. At step 220, a CAD model of the site is scaled and aligned with the physical environment at the site, such that size and position of elements in model space correspond with objects they represent in physical space. The alignment may involve capturing a point cloud of a portion of the site using the robotic total station 120, and aligning points in the model with corresponding points of the point cloud. In some implementations, where the point cloud is only utilized for alignment, the point cloud may result from a low resolution (e.g., less than a hundred point) scan of the portion of the site. In other implementations, where the point cloud is intended for display along with the model, a higher resolution scan may be utilized. The higher resolution point cloud may be stored aligned with the CAD model.

At step 230, the robotic total station 120 tracks the location of the survey prism 140 by measuring an angle and a distance to the survey prism, and in conjunction with its own known location, performing trigonometric calculations. The current location of the survey prism 140 is wirelessly transmitted to the mobile device 160 and received by the visualization application. At step 240, the orientation sensor of the mobile device 160 captures the orientation of the mobile device (or more specifically of its display screen) and provides it to the visualization application. Alternatively, the orientation of the mobile device may be determined by tracking features in a view captured by the camera of the mobile device. At step 250, the visualization application executing on the mobile device 160 utilizes the received location and locally determined orientation in physical space, to position and orient a virtual camera within model space of the model (and optional aligned point cloud), and a view is generated from the perspective of the virtual camera and displayed on the display screen. While the virtual camera may be positioned to exactly correspond to the location of the survey prism 140, thereby creating a first person view of the model (and optional aligned point cloud), in some embodiments the virtual camera may be offset from (e.g., positioned slightly behind) such location, thereby creating a third person view.

As part of step 250, a location indicator corresponding to the location of the survey prism 140 and survey pole 150 is imposed in the view of the model (and optional aligned point cloud). Further, a tracking unit indicator may be imposed in the view showing the location of the robotic total station 120. It should be understood that additional indicators representing objects in the physical environment may also imposed in the view to assist the user in perceiving how the model corresponds with their current location in the physical environment. Further, one or more additional views (e.g., an overhead terrain view) may also be generated as part of step 250 and displayed simultaneous to the view of the model (and optional aligned point cloud) on the display screen of the mobile device 160. Such additional views may further assist the user in perceiving how the model corresponds with their current location in the physical environment.

Figure 3A:
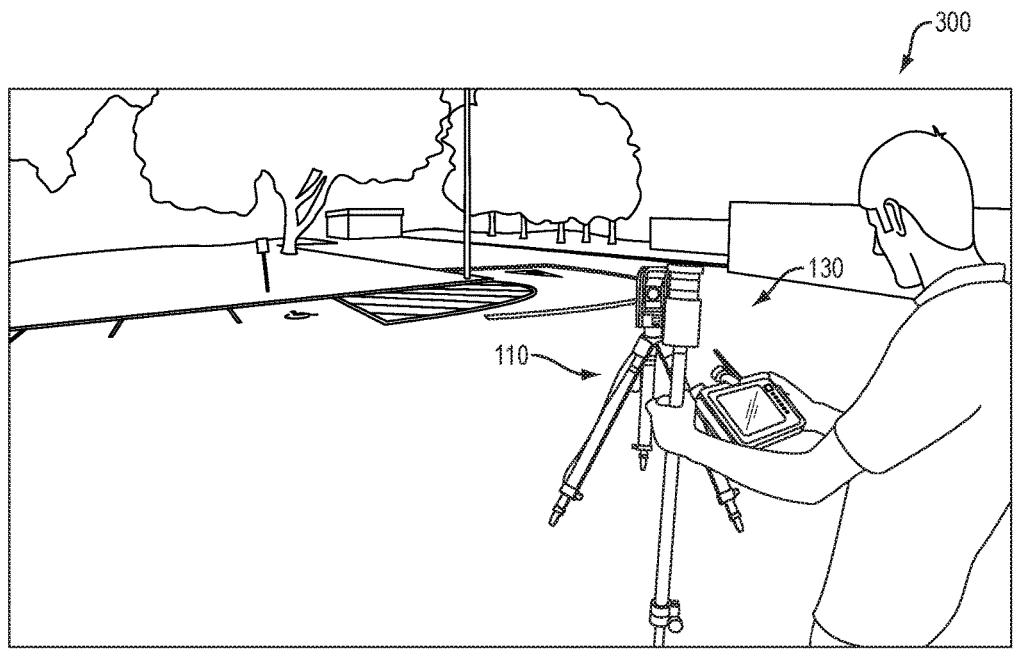
FIG. 3A is a diagram showing a user operating the system of FIG. 1, holding the mobile unit at a location and first orientation in physical space.
Figure 3B:
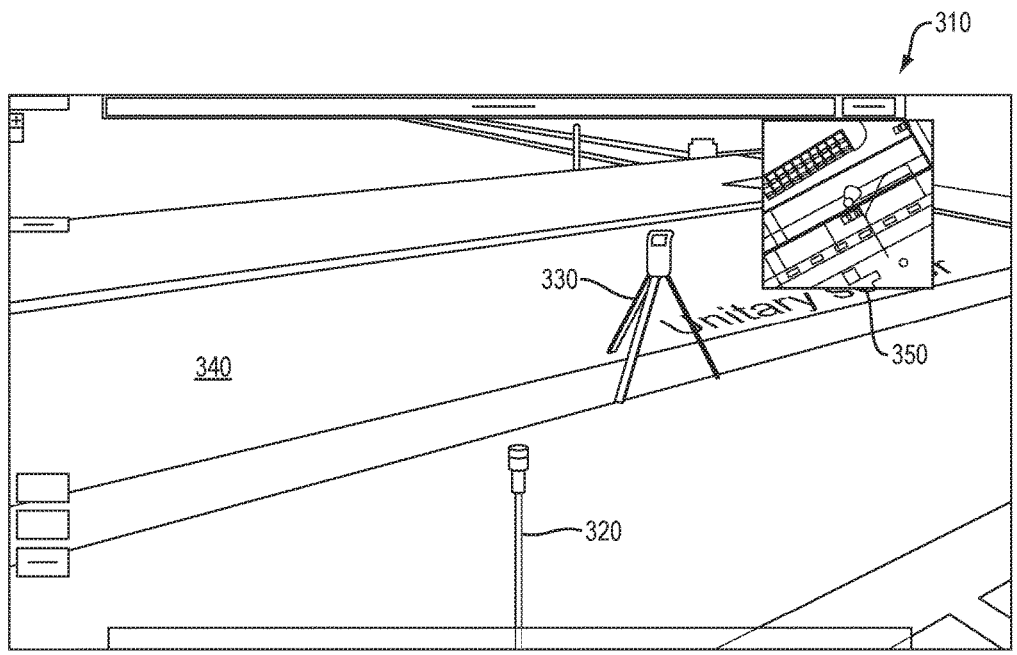
FIG. 3B is a screen shot of an example view of the model displayed by the visualization application, corresponding to the location and first orientation of FIG. 3A.

FIG. 3A is a diagram 300 showing the user operating the system of FIG. 1, holding the mobile unit 130 at a location and first orientation in physical space. FIG. 3B is a screen shot 310 of an example third-person view of a model 340 displayed by the visualization application, corresponding to the location and first orientation of FIG. 3A. The screen shot 310 includes a location indicator 320 and a tracking unit indicator 330 imposed within a third-person view of the model 340. Further, an overhead terrain view 350 is displayed in a separate window.

At step 260, based on the view of the model (and optional aligned point cloud) on the display screen of the mobile device 160, the user changes orientation or location of the mobile unit 130 in the physical environment. Execution loops back to step 230. By repeated execution of steps 230-250, the view of the model (and optional aligned point cloud) on the display screen is updated substantially in real-time as the user moves about the site. In this context, "substantially real-time" should be interpreted to cover a case where there may be a small amount of delay in updating the view in comparison to true real-time, but the amount of delay is not visually noticeable by a user (e.g., is less than 100 milliseconds).

Figure 4A:
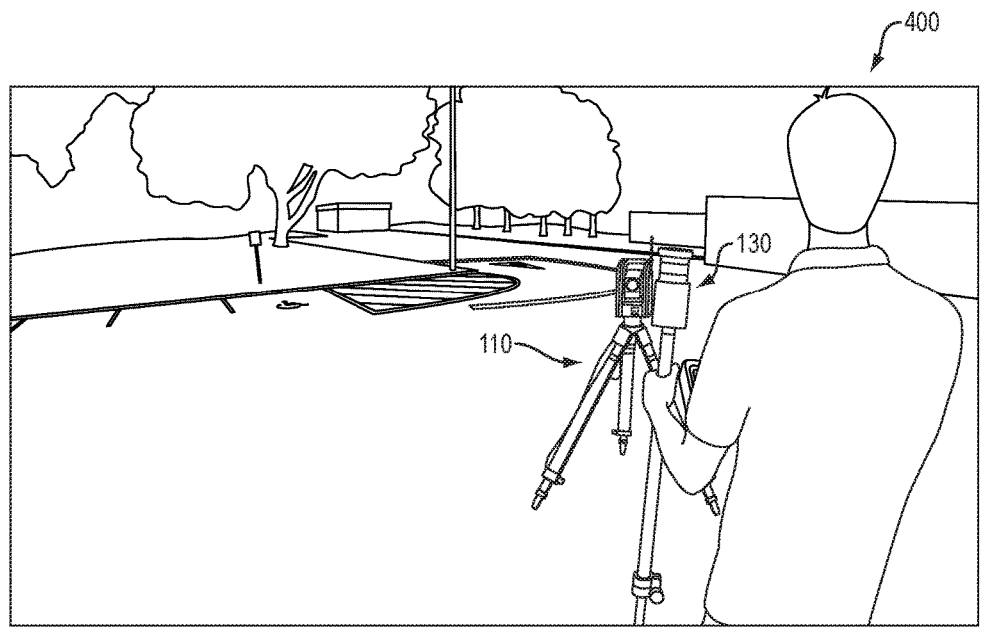
FIG. 4A is a diagram showing the user operating the system of FIG. 1, holding the mobile unit at the same location as FIG. 3A, but at a second orientation.
Figure 4B:
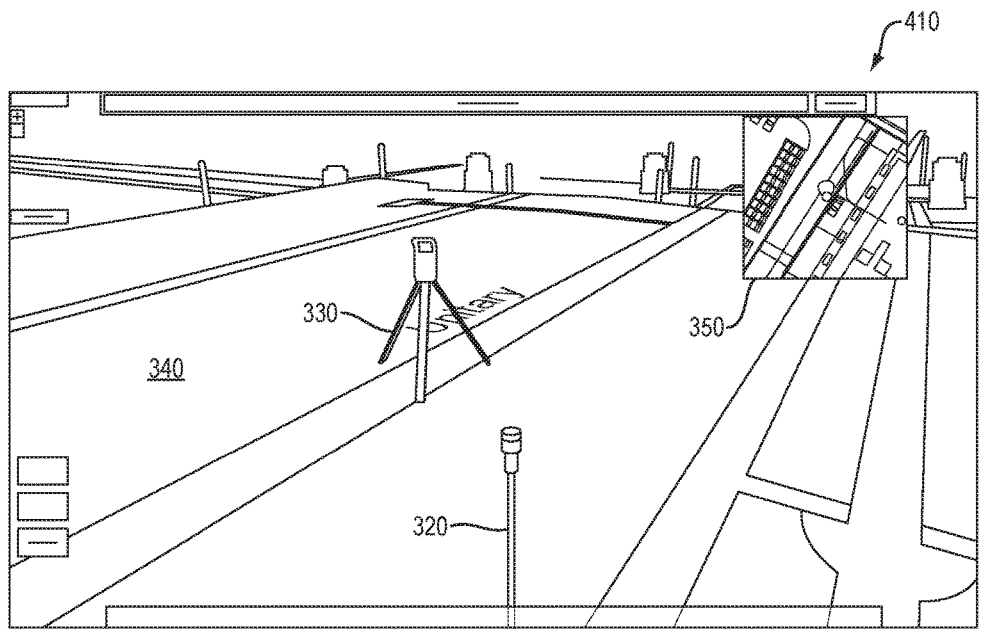

FIG. 4A is a diagram 400 showing the user operating the system of FIG. 1, holding the mobile unit 130 at the same location as FIG. 3A, but at a second orientation. FIG. 4B is a screen shot 410 of an example view of the model 340 displayed by the visualization application corresponding to the location and second orientation of FIG. 4A. While the location indicator 320 is imposed at the same location in the model, the virtual camera has rotated to show the model from a different perspective. Such rotation is further reflected in the overhead terrain view 350 that is displayed in the separate window.

The user may continue to change location and orientation until the location indicator is proximate to an element of interest in view shown on the display screen of the mobile device 160. When this is the case, the survey pole 150 will indicate the location of the corresponding object in the physical environment.

At step 270, the user interacts with the physical environment about the location of the survey pole 150, for example, marking the ground at the current location of the survey pole 150, thereby transferring information from the model to the site.

In some embodiments, the above discussed techniques for accurate onsite model visualization may be used in conjunction with virtual excavations to convey model data related to hidden objects (e.g., underground objects). In this context, a virtual excavation refers to a virtual "hole" in a solid surface represented in the model (and optional aligned point cloud), e.g., a solid surface representing the ground, that provides visual access to elements that would normally be obscured from view. A virtual excavation may be defined by a planar bottom boundary surface, and planar side boundary surfaces, to which textures are mapped, while being open to the top. A virtual excavation may be movable within model space, such that it may be positioned to provide visual access to a desired element (e.g., the element extending into the space defined by the virtual excavation thereby becoming visible through the open top).

Figure 5:
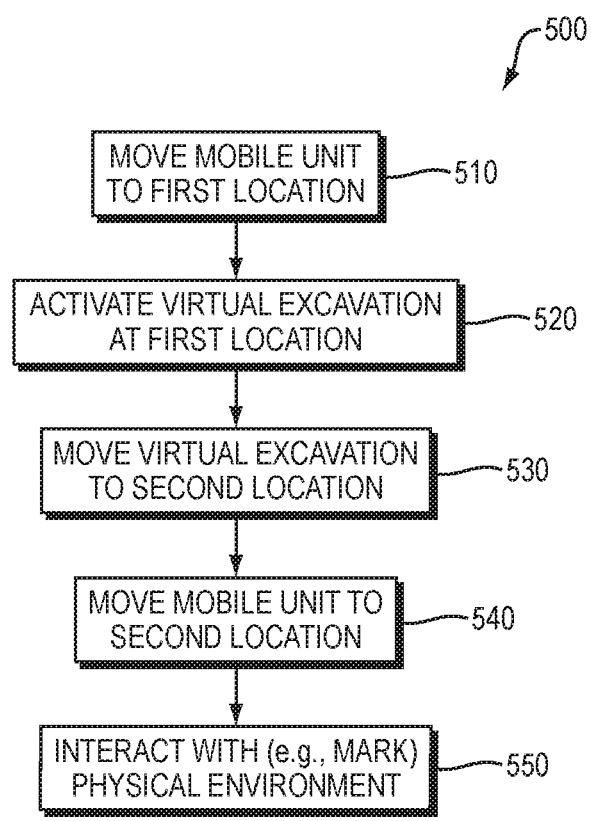
FIG. 5 is flow diagram of an example sequence of steps for using a virtual excavation to visualize elements corresponding to hidden objects (e.g., underground objects) that may be implemented in conjunction with the example steps of FIG. 2.
Figure 6A:
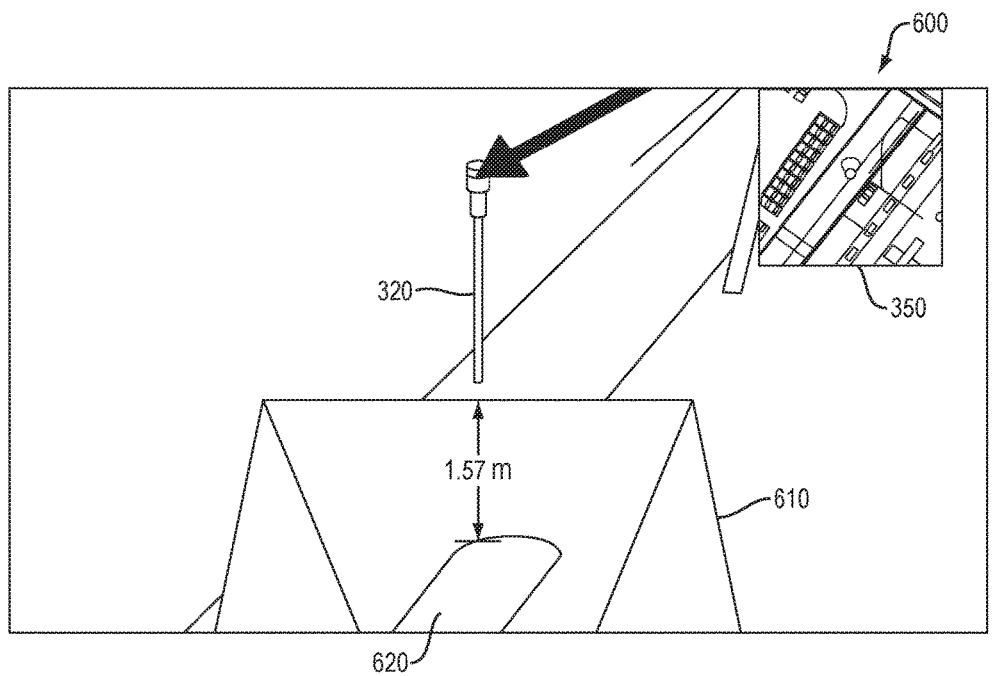
FIG. 6A is a screen shot of an example initial view of the model displayed by the visualization application with a virtual excavation disposed at a first location.

FIG. 5 is flow diagram of an example sequence of steps 500 for using a virtual excavation to visualize elements corresponding to hidden objects (e.g., underground objects) that may be implemented in conjunction with the example steps of FIG. 2. At step 510, the user moves the mobile unit 130 to a first location and observes an initial view of the model (and optional aligned point cloud), on the display screen of the mobile device 160. At step 520, the user may activate the display of a virtual excavation in this initial view of the model (and optional aligned point cloud), using a user interface (UI) of the visualization application. The virtual excavation may be disposed at a first location in model space. FIG. 6A is a screen shot 600 of an example initial view of a model displayed by the visualization application with a virtual excavation 610 disposed at a first location. In this example, a first element 620 corresponding to a first hidden object (specifically a first underground pipe) is shown disposed internal to the virtual excavation 610. In this example, a vertical distance indicator indicates a vertical distance (e.g., between the element 620 and the surface) is 1.57 meter.

At step 530, the user moves the virtual excavation in model space to a second location using the UI of the visualization application. While the virtual excavation is being moved, the virtual camera used to generate the view of the model (and optional aligned point cloud) may be allowed to freely move so that the model may be explored independent of movement in the physical environment. The movement may reveal a second element corresponding to a hidden object of interest.

Figure 6B:
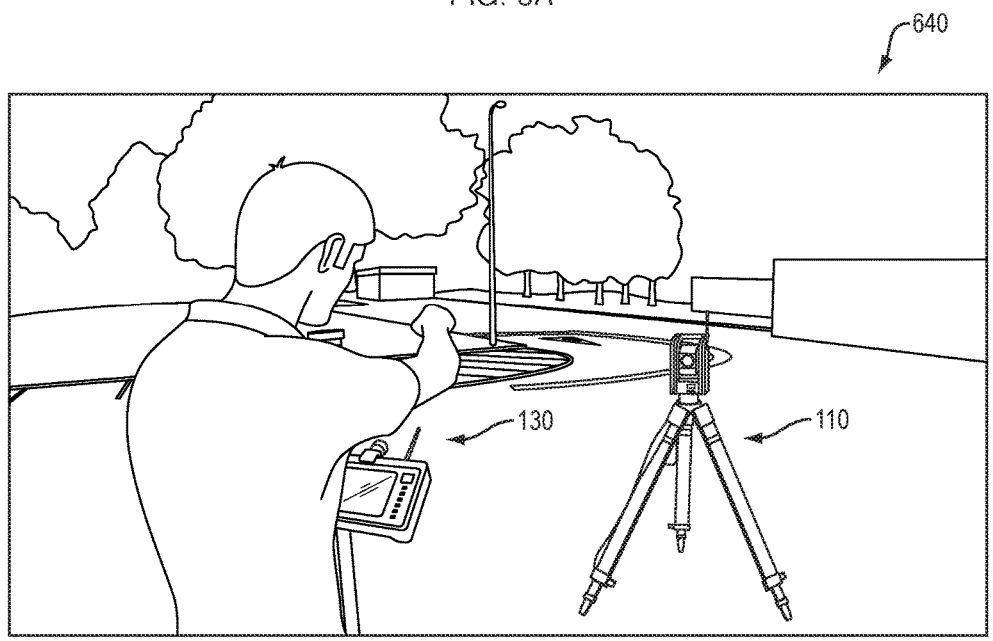
FIG. 6B is a diagram showing a user interacting with the UI of the visualization application to move the virtual excavation to a second location.

FIG. 6B is a diagram 640 showing a user manipulating the UI of the visualization application to move the virtual excavation 610 to a second location. The interaction may involve entering touch input (e.g., a "click", "drag", etc.) on a touch sensitive display of the mobile device 160. The second location may be remote from the first location. In the example in FIG. 6B, the user is shown pointing towards a remote second location. It should be understood that such pointing is simply to illustrate the general area in the physical environment corresponding to the second location. Hand gestures recognition is not required to move the virtual excavation 610.

Figure 6C:
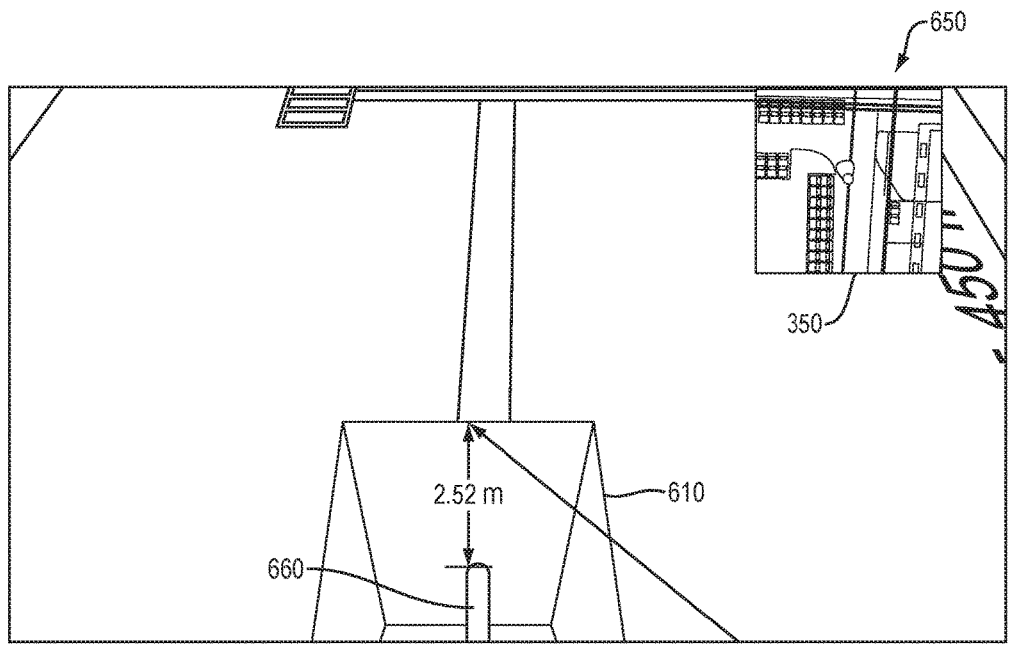
FIG. 6C is a screen shot of an example view of the model displayed by the visualization application with the virtual excavation disposed at the second location.

FIG. 6C is a screen shot 650 of an example view of the model displayed by the visualization application with the virtual excavation 610 disposed at the second location. In this example, a second element 660 corresponding to a hidden object of interest, namely a specific underground pipe of interest, is shown disposed internal to the virtual excavation 610 at the second location. The vertical distance indicator indicates an updated vertical distance (e.g., between the second element 660 and the surface) is 2.52 meter. A horizontal distance indicator (not fully shown) shows a horizontal distance to target (e.g., between the virtual excavation 610 and the location indicator 320).

At step 540, the user moves the mobile unit 130 in physical space, observing the view of the model (and optional aligned point cloud) to bring the location indicator proximate to the virtual excavation and thereby the second element representing the hidden object of interest.

Figure 6D:
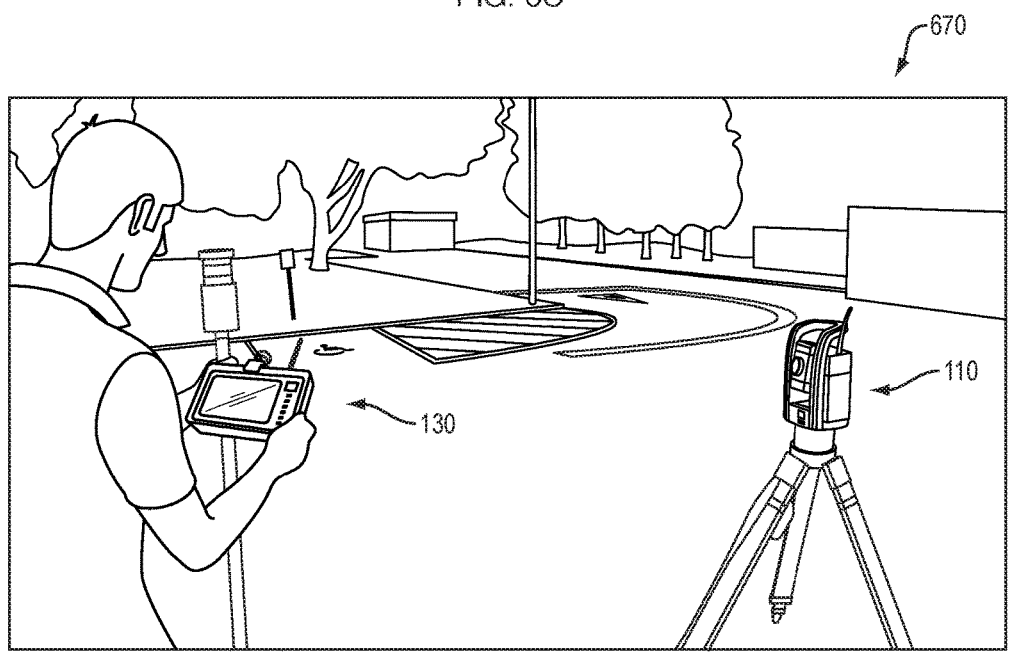
FIG. 6D is a diagram showing the user disposed at a second location in the physical environment.
Figure 6E:
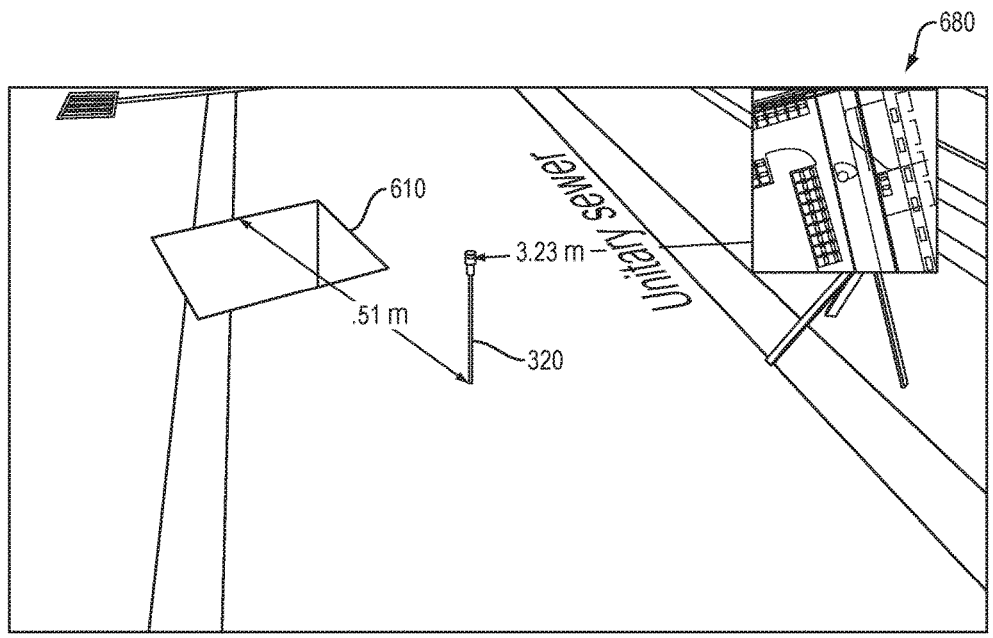
FIG. 6E is a screen shot of an example view of the model displayed by the visualization application with the location indicator disposed proximate to the virtual excavation.

FIG. 6D is a diagram 670 showing the user disposed at a second location in the physical environment. FIG. 6E is a screen shot 680 of an example view of the model displayed by the visualization application with the location indicator disposed proximate to the virtual excavation 610. The horizontal distance indicator indicates that the horizontal distance to target is 0.51 meters.

At step 540, when the mobile unit 130 reaches the location in the physical environment where the user observes in the view of the model (and optional aligned point cloud) the location indicator coincides with an element representing the hidden object of interest in the virtual excavation, the user interacts with the location in the physical environment (e.g., marks the location).

Figure 6F:
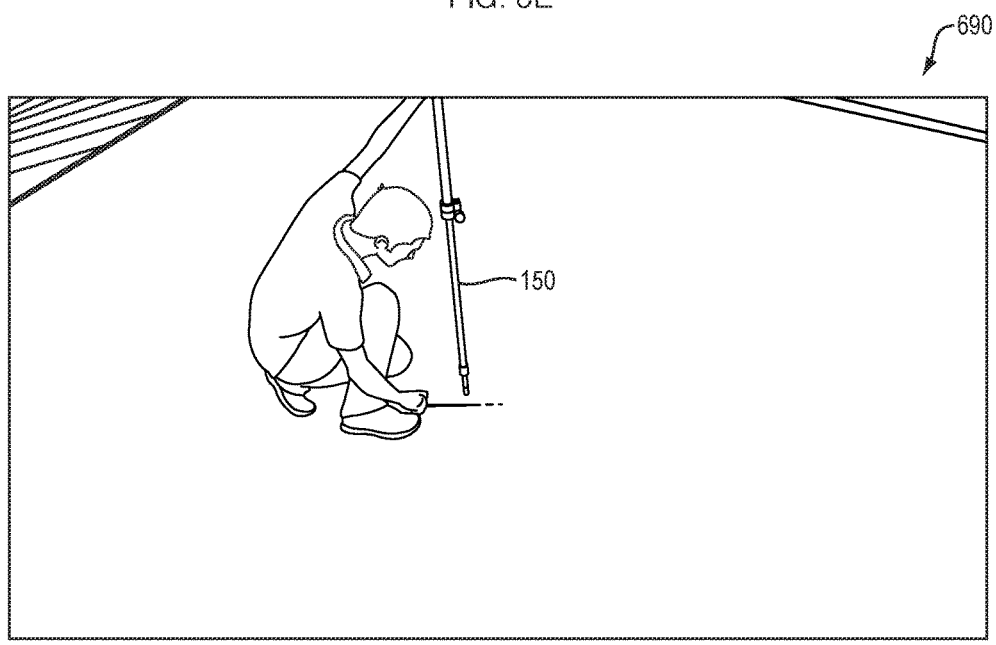
FIG. 6F is a diagram showing the user marking a location in the physical environment based on the view of the model.

FIG. 6F is a diagram 690 showing the user marking a location in the physical environment based on the view of the model. Here, the user makes the location indicated by the survey pole 150 to indicate the location of the hidden object of interest.

In conclusion, while the above description discusses example techniques for on-site model visualization that may facilitate interaction (e.g., marking of locations) at a site based on model data, it should be understood that a number of modifications and/or additions may be made without departing from the disclosure's intended spirit and scope. In general, it should be understood that many of the above discussed techniques may be implemented in software, in hardware, or in a combination thereof. A software implementation may include electronic device-executable instructions stored in a non-transitory electronic device-readable medium, such as a volatile or persistent memory, a hard-disk, a compact disk (CD), or other storage medium. A hardware implementation may include specially configured processors, application specific integrated circuits (ASICs), and/or other types of hardware components. Further, a combined software/hardware implementation may include both electronic device-executable instructions stored in a non-transitory electronic device-readable medium, as well as one or more specially configured hardware components. Above all, it should be understood that the above descriptions are meant to be taken only by way of example.

What is claimed is:

1. A method for onsite model visualization that facilitates interaction with a physical environment at the site, comprising:
   aligning a computer aided design (CAD) model of a site with the physical environment;
   tracking a location of a mobile unit carried by the user as the user moves about the physical environment;
   determining an orientation of the mobile unit in the physical environment as the user moves about the physical environment;
   displaying, on a display screen of the mobile unit, a view of the CAD model from a virtual camera whose location and orientation is based on the location and the orientation of the mobile unit in the physical environment, the view of the CAD model being updated substantially in real-time as the user moves about the physical environment and including a location indicator corresponding to the location of the mobile unit within physical space; and
   interacting, by a user, with the physical environment, based on the location indicator in the view of the CAD model.

2. The method of claim 1, wherein the CAD model includes elements that represent hidden objects, and the interacting includes marking a location of a hidden object in the physical environment based on the location indicator in the view of the CAD model coinciding with a location of an element in the CAD model that represents the hidden object.

3. The method of claim 1, wherein the view of the CAD model is a third person view, and the location of the virtual camera is offset from the location of the indicator in the view of the CAD model.

4. The method of claim 1, further comprising:
   capturing a point cloud of the physical environment; and
   aligning the point cloud with the CAD model,
   wherein the displaying displays the view of the CAD model together with the aligned point cloud from the virtual camera.

5. The method of claim 1, wherein the mobile unit includes a survey prism and the tracking comprises:
   measuring, by a robotic total station positioned at a known location at the site, an angle and a distance to the mobile unit relative to the robotic total station; and
   using trigonometric calculations to determine the location of the mobile unit from the angle and the distance.

6. The method of claim 1, wherein the aligning further comprises:
   capturing, by a robotic total station, a scan of the physical environment at the site, the scan to include a plurality of points;

aligning the points of the CAD model with corresponding points of the scan.

7. The method of claim 1, wherein the mobile unit includes a mobile device that includes the display screen and an orientation sensor, and the determining the orientation comprises:
measuring, by the orientation sensor of the mobile device, an orientation of the mobile unit.

8. The method of claim 1, wherein the mobile unit includes a mobile device that includes the display screen and a camera, and the determining the orientation comprises:
capturing a view of the physical environment by the camera of the mobile device; and
tracking features in the view of the physical environment and based thereon estimating the orientation of the mobile unit.

9. The method of claim 1, wherein the mobile unit includes a survey pole that when disposed upon the ground indicates a location, and the interacting further comprises:
marking the location indicated by the survey pole upon the ground when the location indicator in the view of the CAD model coincides with a location of an element in the CAD model.

10. The method of claim 1, wherein the mobile unit includes a mobile device co-located with a survey prism coupled to a survey pole, the tracking is performed by a robotic total station that detects the survey prism and determines the location of the survey pole, and the interacting includes marking a location indicated by the survey pole upon the ground when the location indicator in the view of the CAD model displayed on the display screen of the co-located mobile device coincides with a location of an element in the CAD model.

11. The method of claim 1, further comprising:
imposing a virtual excavation in the view of the CAD model on the display screen of the mobile unit; and
displaying one or more elements that represent hidden objects within the virtual excavation.

12. The method of claim 11, further comprising:
in response to user input on the mobile unit, moving the virtual excavation within the view of the CAD model to a location initially remote from the location indicator in the view of the CAD model; and
moving the mobile unit, by the user, within the physical environment to bring the location indicator in the view of the CAD model to the virtual excavation, such that the location indicator coincides with a location of an element in the CAD model that represents a hidden object within the virtual excavation.

13. The method of claim 12, further comprising:
marking a location in the physical environment when the location indicator coincides with the location of the element that represents the hidden object within the virtual excavation in the CAD model.

14. The method of claim 11, wherein the hidden objects includes an underground pipe.

15. A non-transitory electronic device-readable medium that includes instructions executable on one or more electronic-devices that, when executed, are operable to:
align a computer aided design (CAD) model of a site with a physical environment at the site, the CAD model including elements that represent hidden objects that are not visible in the physical environment;
track a location of a mobile unit carried by a user as the user moves about the physical environment;
display a view of the CAD model on a display screen of the mobile unit, the view of the CAD model including a location indicator corresponding to the location of the mobile unit within physical space, the location indicator updated substantially in real-time as the user moves about the physical environment; and
prompt the user to move within the physical environment to cause the location indicator in the view of the CAD model to coincide with a location of an element in the CAD model that represents a hidden object, and to mark the location of the hidden object in the physical environment when the location indicator in the view of the CAD model coincides with a location of an element in the CAD model that represents a hidden object.

16. The non-transitory electronic device-readable medium of claim 15, wherein the view of the CAD model is displayed as viewed from a virtual camera whose location is based on the location of the mobile unit in the physical environment.

17. The non-transitory electronic device-readable medium of claim 16, wherein the instructions, when executed, are further operable to:
determine an orientation of the mobile unit in the physical environment as the user moves about the physical environment,
wherein the virtual camera has an orientation based on the orientation of the mobile unit in the physical environment.

18. The non-transitory electronic device-readable medium of claim 17, wherein the view of the CAD model is a third person view, and the location of the virtual camera is offset from the location of the indicator in the view of the CAD model.

19. The non-transitory electronic device-readable medium of claim 15, wherein the instructions that prompt includes a display of a distance to target that is updated substantially in real-time as the user moves about the physical environment.

20. The non-transitory electronic device-readable medium of claim 15, wherein the instructions, when executed, are further operable to:
impose a virtual excavation in the view of the CAD model on the display screen of the mobile unit; and
display one or more elements that represent hidden objects within the virtual excavation.

21. The non-transitory electronic device-readable medium of claim 20, wherein the instructions, when executed, are further operable to:
provide a user interface capable of moving the virtual excavation within the view of the CAD model without moving the mobile unit in the physical environment; and
display a distance to target associated with the virtual excavation that is updated substantially in real-time as the user moves about the physical environment.

22. An apparatus for onsite model visualization that facilitates interaction with the environment, comprising:
a robotic total station positioned at a known location at a site; and
a mobile unit that is user movable about the site, the mobile unit including a survey prism detectable by the robotic total station, a survey pole coupled to the survey prism that when disposed upon the ground indicates a location, and a mobile device co-located with the survey pole, the mobile device including an orientation sensor or camera and configured to execute a visualization application that is operable to:
determine a location of the mobile unit based on information received from the robotic total station, determine an orientation of the mobile unit based on information from the orientation sensor or camera, display on the display screen of the mobile device a view of a computer aided design (CAD) model of the site as seen from a virtual camera whose location is based on the location and the orientation of the mobile unit, the CAD model including elements that represent hidden objects that are not visible at the site, the view of the CAD model being updated substantially in real-time as a user moves the mobile unit about the site, the view of the CAD model to include a location indicator corresponding to the location of the mobile unit within physical space at the site.

\* \* \* \* \*